United States Patent [19]

Ueno et al.

[11] Patent Number: 4,532,199
[45] Date of Patent: Jul. 30, 1985

[54] METHOD OF FORMING AMORPHOUS SILICON FILM

[75] Inventors: Tsuyoshi Ueno, Fujisawa; Katsumi Suzuki, Tokyo; Masataka Hirose, Hiroshima, all of Japan

[73] Assignee: Tokyo Shibaura Denki Kabushiki Kaisha, Kawasaki, Japan

[21] Appl. No.: 583,855

[22] Filed: Feb. 27, 1984

[30] Foreign Application Priority Data

Mar. 1, 1983 [JP] Japan .................................. 58-33385

[51] Int. Cl.³ .............................................. G03G 5/082
[52] U.S. Cl. ...................................... 430/128; 427/39; 427/45.1; 427/86; 430/133
[58] Field of Search ................. 148/174; 427/39, 45.1, 427/74, 86; 136/258 AM; 430/85, 86, 95, 128, 133

[56] References Cited

U.S. PATENT DOCUMENTS

| | | | |
|---|---|---|---|
| 4,064,521 | 12/1977 | Carlson | 357/2 |
| 4,438,188 | 3/1984 | Shimatani et al. | 430/128 |
| 4,439,463 | 2/1982 | Miller | 427/39 |

FOREIGN PATENT DOCUMENTS

| | | | |
|---|---|---|---|
| 0027553 | 4/1981 | European Pat. Off. | 12001981/GBX |
| 3322680 | 1/1984 | Fed. Rep. of Germany . | |
| 57-46224 | 1/1982 | Japan . | |
| 57-66625 | 4/1982 | Japan | 136/258 AM |

*Primary Examiner*—Aaron Weisstuch
*Attorney, Agent, or Firm*—Cushman, Darby & Cushman

[57] ABSTRACT

A method of forming an amorphous silicon film includes the steps of bringing a gas which is pre-excited by electron cyclotron resonance generated by an alternating electric field and a magnetic field into contact with a raw material gas containing silicone atoms in a reaction chamber in which a substrate is placed, so that the raw material gas is converted to radicals, and forming an amorphous silicon film on a surface of the substrate by the reaction of radicals therewith. Microwaves can be used as the alternating electric field.

5 Claims, 2 Drawing Figures

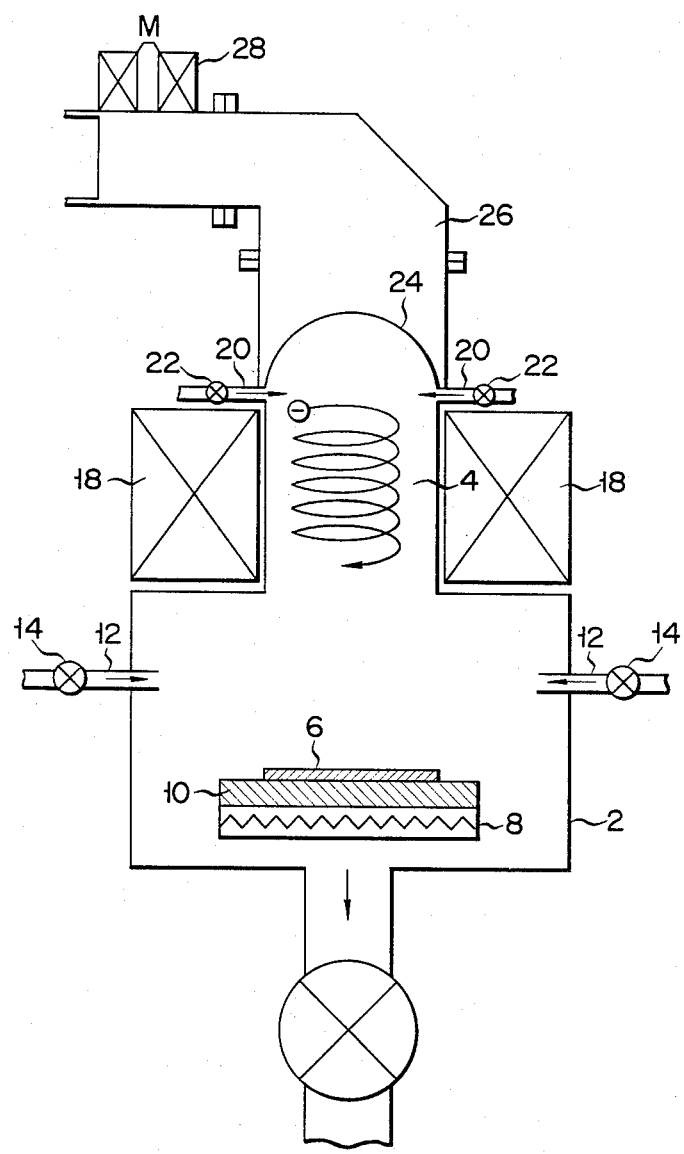
F I G. 1

F I G. 2
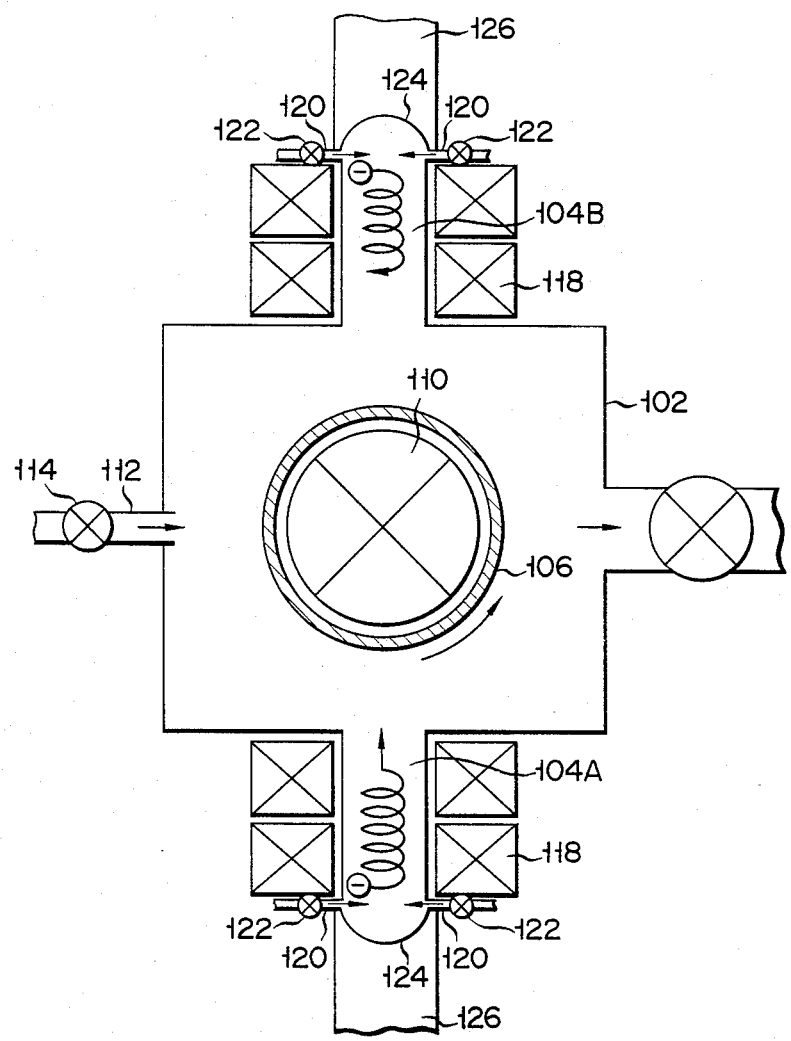

METHOD OF FORMING AMORPHOUS SILICON FILM

BACKGROUND OF THE INVENTION

The present invention relates to a method of forming an amorphous silicon film on a base, e.g., a conductive substrate.

Conventional glow discharge as one of the standard methods of forming an amorphous silicon film on a conductive substrate is performed as follows. A raw material gas such as $SiH_4$ is supplied to a vacuum chamber as a reaction vessel which is maintained at a vacuum, and a DC or AC voltage or an electromagnetic wave is applied to an electrode opposing the conductive substrate in the vacuum chamber, thereby effecting glow discharge to generate a plasma. The plasma containing ions and radicals is brought into contact with the conductive substrate disposed in the vacuum chamber, and an amorphous silicon film is formed on the conductive substrate.

However, according to this conventional method, a plasma containing a large number of silicon radicals cannot be easily generated unless high power is applied. When the power applied falls within the range between several tens of watts to several hundreds of watts, the deposition rate of the amorphous silicon film on the conductive substrate is low. A maximum rate is at best 3 μm/hour, resulting in inconvenience. Therefore, it takes at least six hours to form an amorphous silicon film to a thickness of 20 μm. Thus amorphous silicon photoconductors cannot be manufactured on a high-speed mass production line. However, when higher power is applied to increase the deposition rate of the amorphous silicon film, the silicon powder produced by expitaxial reaction in the raw material gas clogs the exhaust system of the manufacturing apparatus. In addition to this disadvantage, when the power is increased, the amount of $Si=H_2$ bonds becomes higher than that of $Si-H$ bonds, so that the photoconductivity of the resultant amorphous silicon film is degraded.

SUMMARY OF THE INVENTION

The present invention has been made in consideration of the above disdavantages and has for its object to provide a method of forming on a mass production line an amorphous silicon film having good photoconductivity.

In order to achieve the above object of the present invention, there is provided a method of forming an amorphous silicon film, comprising the steps of bringing a gas pre-excited by electron cyclotron resonance generated by an alternating electric field and a magnetic field into contact with a raw material gas containing silicon atoms in a reaction chamber in which a substrate is placed, so that the raw material gas is converted to radicals, and forming an amorphous silicon film on a surface of the substrate by reaction of the radicals therewith.

BRIEF DESCRIPTION OF THE DRAWINGS

FIG. 1 is a schematic view showing an apparatus for forming an amorphous silicon film in accordance with the method of the present invention; and FIG. 2 is a schematic view showing a modification of the apparatus shown in FIG. 1.

DETAILED DESCRIPTION OF THE PREFERRED EMBODIMENTS

Various types of gases can be used as a gas to be pre-excited, in accordance with the desired characteristics of the silicon film to be formed.

For example, a rare gas such as He, Ne, or Ar can be used as the gas to be pre-excited. The rare gas is excited to produce a rare gas plasma. The rare gas plasma increases the decomposition efficiency of the raw material gas to form an amorphous silicon film with good photoconductivity properties at a high rate. In greater detail, the rare gases such as He, Ne, Ar, Kr, and Xe (shown in Table 1) have a high ionization potential and a high metastable energy level.

TABLE 1

| Energy level | Rare gas | | | | |
|---|---|---|---|---|---|
| | He | Ne | Ar | Kr | Xe |
| Ionization level (eV) | 24.5 | 21.5 | 15.7 | 14.0 | 12.1 |
| Metastable level (eV) | 19.80 | 16.62 | 11.55 | 9.91 | 8.32 |

The rare gas ion or atom which is pre-excited at the high ionization potential or metastable energy level serves as an active species since it has high ionization potential. This rare gas ion or atom reacts with other molecules or atoms to dissociate, ionize or excite these molecules or atoms.

The necessary energy for various dissociation reactions of $SiH_4$ gas as an example of a material gas is given as follows:

4.4 eV for $SiH_4 \rightarrow Si + 2H_2$
5.9 eV for $SiH_4 \rightarrow SiH + H_2 + H$
2.1 eV for $SiH_4 \rightarrow SiH_2 + H_2$
4.1 eV for $SiH_4 \rightarrow SiH_3 + H$ The ionized rare gas or the rare gas atoms excited in the metastable state can be used to dissociate the $SiH_4$ gas in the above reaction steps. The rare gas atoms in the metastable state have a life as long as from $10^{-4}$ seconds to a few seconds. Furthermore, the rare gas atoms in the metastable state return to the ground state with multiple scattering of other molecules and atoms. For this reason, the rare gas atoms in the ionized or metastable state can effectively dissociate $SiH_4$. The rare gas atoms in the ground state are inert, and thus are not deposited on the amorphous silicon film. As a result, the amorphous silicon film can be formed such that its photoconductivity is not degraded.

The gas to be pre-excited may include: a gas which contains at least one of the molecules ($H_2$, $CH_4$, $N_2$, $O_2$) which contains an atom selected from the group consisting of H, C, N, O and F; and a gas containing any one of the molecules (e.g., $B_2H_6$ and $PF_5$) having an element of Group IIIA or Group VA of the Periodic Table. The gas of this type can excite the raw material gas and is doped into the amorphous silicon film in order to control the electrical or optical proparties of the amorphous silicon film. The dopant gases need not always be contained in the gas to be pre-excited. The gas to be pre-excited may comprise a rare gas or hydrogen gas, and another gas containing the doping atoms can be mixed in the raw material gas.

The gas pre-excitation can be performed by electron cyclotron resonance generated by microwaves and a magnetic field. The electron cyclotron resonance is performed by applying the microwaves (generated by a microwave generator) to the gas supplied in the magnetic field.

The raw material gas comprises a gas which contains at least silicon-atom-containing molecules such as $SiH_4$ and/or $Si_2H_6$ gas. The raw material gas may be diluted by hydrogen gas. In addition, the raw material gas may contain dopant gases, as described above.

The conversion of the raw material gas to radicals by means of a plasma gas pre-excited by electron cyclotron resonance is performed such that the raw material gas and the pre-excited gas are simultaneously supplied to a vacuum chamber at a reduced pressure and are mixed therein. Alternatively, a space for exciting the gas is formed in the vacuum chamber, and the gas to be excited is supplied to this space. After the gas is excited in the space, the pre-excited gas is brought into contact with the raw material gas which is supplied separately, so that the raw material gas can be excited to radicals.

The radicals prepared by exciting the material gas are brought into contact with the substrate, and an amorphous silicon film is formed on the substrate.

The substrate comprises a conductive material such as aluminum which is formed to have a plate-like or a drum shape. When the radicals prepared by exciting the material gas are brought into contact with the substrate, the substrate is preferably heated to a temperature of 100° to 400° C. When the substrate has a drum shape, the plasma gas is preferably brought into contact with the substrate while the substrate is rotated, so that the amorphous silicon film can be uniformly formed along the circumferential direction of the drum.

The method of the present invention can be applied to various types of apparatuses. An amorphous silicon photoconductive film forming apparatus to which the method of the present invention is applied will be described in detail to best understand the method of the present invention.

An amorphous silicon photoconductive film forming apparatus shown in FIG. 1 has a hermetic vessel such as a vacuum chamber 2 which can be freely opened/closed, and a pre-excitation reactor 4. A support plate 10 is mounted in the vacuum chamber 2. A plate-like substrate 6 is placed on the support plate 10. The support plate 10 has a heater 8 for heating the substrate 6 placed on the support plate 10. At least one raw material gas supply pipe 12 is coupled to the vacuum chamber 2 through a valve 14 to supply the raw material gas onto the substrate 6. The vacuum chamber 2 is also provided with an exhaust device such as a mechanical booster pump (not shown), a diffusion pump (not shown) and a rotary pump (not shown). The vacuum chamber 2 and the pre-exciting reactor 4 can be evacuated to a high vacuum of $10^{-6}$ Torr. The pre-excitation reactor 4 is disposed at the upper portion of the vacuum chamber 2. A coil 18 is mounted around the pre-exciting reactor 4. When electric power is applied to the coil 18, a magnetic field is generated in the pre-exciting reactor 4. A gas supply pipe 20 is coupled to the pre-exciting reactor 4 through a valve 22 to supply the gas to be pre-excited. A circular waveguide 26 is connected to the pre-excitation reactor 4 through a quartz glass separator 24. A microwave generator M having a magnetron 28 is arranged on the waveguide 26.

An apparatus as shown in FIG. 2 is used to form an amorphous silicon film on an outer surface of a drum-shaped substrate. The apparatus has a hermetic reaction vessel such as a vacuum chamber 102 which can be freely opened/closed, and a pair of pre-excitation reactors 104A and 104B which are disposed to oppose each other at the two ends of the vacuum chamber 102. A support drum 110 is mounted in the vacuum chamber 102 to support a substrate 106 thereon, and rotates together with the substrate 106. The support drum 110 has a heater for heating the substrate 106 at a predetermined temperature. A raw material gas supply pipe 112 is coupled to a side surface of the vacuum chamber 102 through a valve 114 to supply the material gas to the vacuum chamber 102. The vacuum chamber 102 is also provided with an exhaust device such as a mechanical booster pump (not shown), a diffusion pump (not shown) and a rotary pump (not shown). The vacuum chamber 102 and the pre-excitation reactors 104A and 104B can be evacuated to a high vacuum of $10^{-6}$ Torr. Coils 118 are mounted around the pre-excitation reactors 104A and 104B, respectively. When electric power is applied to the coils 118, magnetic fields are formed in the plasma generation chambers 104A and 104B, respectively. The pre-excitation reactors 104A and 104B have valves 122, respectively. Gas supply pipes 120 are coupled to the pre-excitation reactors 104A and 104B, respectively, to supply the gas to the corresponding reactors 104A and 104B. Circular waveguides 126 are connected to the pre-excitation reactors 104A and 104B through quartz glass separators 124, respectively. Microwave generators (not shown) having magnetrons (not shown) are mounted on the waveguides 126, respectively.

The method of the present invention which is employed by the amorphous silicon photosensitive film forming apparatuses shown in FIGS. 1 and 2 will be described by way of examples.

EXAMPLE 1

The apparatus shown in FIG. 1 was used.

After the vacuum chamber 2 was opened and a substrate 6 was placed on the support plate 10, the vacuum chamber 2 was hermetically sealed. The substrate 6 was heated by the heater 8 to a temperature of 300° C. The vacuum chamber 2 and the pre-excitation reactor 4 were evacuated by the diffusion pump and the rotary pump to a pressure of $10^{-6}$ Torr. The valves 14 and 22 were opened to supply 99.999% $H_2$ gas to the pre-excitation reactor 4 and 100% $SiH_4$ gas to the vacuum chamber 2, respectively. The exhaust system of the vacuum chamber 2 was switched from a diffusion pump and a rotary pump to a mechanical booster pump and a rotary pump. After the flow rates of the $H_2$ gas and $SiH_4$ gas were controlled to be 100 SCCM ($cm^3$/min) and 150 SCCM, respectively (dilution ratio of 60%), the exhaust system was controlled to set the pressure in the vacuum chamber 2 and in the pre-excitation reactor 4 to be 0.3 Torr.

The magnetron 28 was operated to generate 2.45-GHz microwaves of 300 W power. At the same time, AC electric power is supplied to the coil 18 to form a magnetic field having a magnetic flux density of 875 Gauss in the pre-excitation reactor 4. Electron cyclotron resonance occurred in the pre-exciting reactor 4 due to the microwaves and the magnetic field, so that the electrons performed helical motion as shown in FIG. 1. As a result, hydrogen was effectively excited to produce a hydrogen plasma gas containing a number of hydrogen radicals.

The hydrogen plasma gas was supplied from the pre-excitation reactor 4 to the vacuum chamber 2 and was brought into contact with the raw material gas. The hydrogen radicals reacted with SiH$_4$ to produce a number of silicon radicals. The silicon radicals were brought into contact with the surface of the substrate 6 heated to the temperature of 300° C., and an amorphous silicon film was formed on the surface of the substrate 6.

The amorphous silicon film was formed within one hour in the manner as described above.

After one hour, the magnetron 28 was turned off, and the AC power was turned off. Furthermore, the valves 14 and 22 were closed to terminate supply of the H$_2$ gas and the raw material gas. The pressure in the vacuum chamber 2 was restored to $10^{-4}$ Torr, and the heater 8 was turned off. The substrate 6 was allowed to cool naturally. When the temperature of the substrate 6 had fallen below 100° C., the resultant photoconductive body comprising the amorphous silicon film on the substrate 6 was removed from the vacuum chamber 2.

The thickness of the resultant amorphous silicon film was 12 μm.

In addition, when the photoconductivity of the amorphous silicon film was measured, the dark resistivity was $10^{11}$ Ωcm. The light illuminated resistivity was $10^7$ Ωcm at an illumination density of $10^{15}$ photons/cm$^2$ and a wavelength of 633 nm.

EXAMPLE 2

A gas mixture of 100-SCCM H$_2$ gas and 50-SCCM N$_2$ gas was supplied to the pre-excitation reactor 4. A gas mixture of 200-SCCM (dilution ratio of 57%) SiH$_4$ gas and B$_2$H$_6$ gas having a ratio B$_2$H$_6$/SiH$_4$ of $5 \times 10^{-6}$ was supplied to the vacuum chamber 2. The pressure in the vacuum chamber 2 and in the pre-excitation reactor 4 at the time of plasma generation was set to be 0.2 Torr. All other conditions in Example 2 were the same as those used in Example 1 to form the amorphous silicon film.

The resultant amorphous silicon film was slightly doped with boron atoms and had a thickness of 13 μm.

In addition, when the electrical conductivity of the resultant amorphous silicon film was measured, the dark resistivity was $10^{13}$ Ωcm, and the light illuminated resistivity was $10^7$ Ωcm at an illumination density of $10^{15}$ photons/cm$^2$ and a wavelength of 633 nm.

EXAMPLE 3

The apparatus shown in FIG. 2 was used.

After the vacuum chamber 102 was opened and the substrate 106 was mounted on the support drum 110, the vacuum chamber 102 was hermetically sealed. The substrate 106 was then heated by the heater to a temperature of 300° C. The vacuum chamber 102 and the pre-excitation reactors 104A and 104B were evacuated by the diffusion pump and the rotary pump to a pressure of $10^{-6}$ Torr. The valves 114 and 122 were opened to respectively supply 99.999% H$_2$ gas to the pre-excitation reactors 104A and 104B at a flow rate of 150 SCCM and 100% SiH$_4$ gas to the vacuum chamber 102 at a flow rate of 300 SCCM. At the same time, the exhaust system of the vacuum chamber 102 was switched from a diffusion pump and a rotary pump to a mechanical booster pump and a rotary pump to control the pressure of the vacuum chamber 102 and the plasma generation chambers 104A and 104B at 0.5 Torr.

The magnetrons were operated to generate 2.45-GHz microwaves at 300 W power. At the same time, electric power was supplied to the coils 118 to generate magnetic fields having a magnetic flux density of 875 Gauss in the pre-excitation reactors 104A and 104B, respectively. Electron cyclotron resonance occurred by means of the microwaves and the magnetic fields in the pre-excitation reactors 104A and 104B. The electrons performed helical motion as shown in FIG. 2. As a result, hydrogen could be effectively excited to generate a hydrogen plasma gas containing a number of hydrogen radicals.

The hydrogen plasma gas was supplied from the pre-excitation reactors 104A and 104B to the vacuum chamber 102 and was brought into contact with the raw material gas. The hydrogen radicals reacted with the SiH$_4$ to produce a number of silicon radicals. The silicon radicals were brought into contact with the outer surface of the substrate 106 rotated at a predetermined velocity and heated to a temperature of 300° C., so that an amorphous silicon film was formed on the outer surface of the substrate 106.

The amorphous silicon film was formed for two hours.

After two hours, the magnetrons were turned off, and the electric power was turned off. In addition, the valves 114 and 122 were closed to terminate supply of the H$_2$ gas and the raw material gas. The vacuum chamber 102 was then restored to a pressure of $10^{-4}$ Torr, and the heater was turned off. The substrate 106 was allowed to cool naturally. When the temperature of the substrate 106 had fallen below 100° C., the photoconductive drum comprising the amorphous silicon film on the substrate 106 was removed from the vacuum chamber 102.

The thickness of the resultant amorphous silicon film was 23 μm.

When a DC corona discharge of −6.0 kV was performed for the resultant amorphous silicon photoconductive drum, a surface potential of −200 V was obtained. In addition, when light from a halogen lamp having a luminance of 2.5·lux sec was used to illuminate the amorphous silicon photoconductive body, and dry magnetic brush development was performed using a positive toner, a good image was obtained.

EXAMPLE 4

A mixture of 150-SCCM H$_2$ gas and 80-SCCM N$_2$ gas was supplied to the pre-exciting reactors 104A and 104B. A gas mixture of 300-SCCM (dilution ratio of 57%) SiH$_4$ gas and B$_2$H$_6$ gas having a ratio of B$_2$H$_2$/SiH$_4$ of $2 \times 10^{-6}$ was supplied to the vacuum chamber 102. The deposition time of the amorphous silicon film was 1.5 hours. All other process details in Example 4 were the same as those in Example 3 to obtain an amorphous silicon film.

The resultant amorphous silicon film was slightly doped with boron atoms and had a thickness of 18 μm.

When a DC corona discharge of +6.0 kV was performed on the resultant amorphous silicon photoconductive drum, a surface potential of +500 V was obtained. In addition, when light from a halogen lamp having a luminance of 3.0·lux sec was used to illuminate the amorphous silicon photoconductive drum, and dry magnetic brush development was performed using a negative toner, a good image was obtained. However, a surface potential of only −100 V was obtained for a negative corona charge.

According to the method of the present invention as described above, high energy particles in the plasma generated upon application of several hundreds of watts of power will not directly damage the amorphous silicon film since the plasma generation space is considerably separated from the silicon film growth space. As a result, the photoconductivity of the resultant amorphous silicon film will not be degraded. Furthermore, since the gas is excited by electron cyclotron resonance, the generation rate of the plasma gas is increased, and the amorphous silicon film can be formed at a high rate. When the gas containing the doping atoms is mixed with either the gas to be pre-excited or the raw material gas, amorphous silicon films having different photoconductive characteristics can be obtained.

The amorphous silicon film formed by the method of the present invention is suitably used as an electrophotographic photoconductive body. In addition, the amorphous silicon film can also be used as an image sensor or the like.

What is claimed is:

1. A method of manufacturing an electrophotographic photoconductive drum comprising the steps of:
    (a) providing at least one plasma generation chamber;
    (b) providing a reaction chamber which communicates with, and is spaced apart from, said at least one plasma generation chamber, and in which a rotatable drum having an electrically conductive substrate formed on the cylindrical surface thereof is disposed;
    (c) exciting, in said plasma generation chamber, a plasma generating gas consisting of hydrogen gas or a mixture of hydrogen gas and nitrogen gas by electron cyclotron resonance generated by an alternating electric field and a magnetic field, thereby forming a plasma gas;
    (d) introducing a raw material gas comprising a silicon atom-containing gas into said reaction chamber and directing the stream of said raw material gas toward said drum along a raw material gas feed direction;
    (e) rotating said drum while introducing said plasma gas from said at least one plasma generation chamber into said reaction chamber in a plasma gas feed direction such that said plasma gas feed direction intersects with said raw material gas feed direction;
    (f) continuing to rotate said drum while contacting said plasma gas stream with said raw material gas in said reaction chamber thereby converting said raw material gas into radicals; and
    (g) forming a photoconductive film comprising amorphous silicon on said conductive substrate of said rotating drum by reaction of said radicals with said substrate surface.

2. A method according to claim 1 wherein the alternating electric field is constituted by microwaves.

3. A method according to claim 1, wherein said silicon atom-containing gas is silane or disilane.

4. A method according to claim 1, wherein said raw material gas further comprises a gas containing a dopant element selected from the elements belonging to Groups IIIA and VA of the Periodic Table.

5. A method according to claim 1, wherein a second plasma generation chamber is also provided such that said second plasma generation chamber is opposed to said first plasma generation chamber, and said plasma is also introduced into said reaction chamber from said second plasma generation chamber.

* * * * *

UNITED STATES PATENT AND TRADEMARK OFFICE
CERTIFICATE OF CORRECTION

PATENT NO. : 4,532,199

DATED : July 30, 1985

INVENTOR(S) : Tsuyoshi Ueno, Katsumi Suzuki and Masataka Hirose

It is certified that error appears in the above-identified patent and that said Letters Patent is hereby corrected as shown below:

Title page:

[73] Assignee: Tokyo Shibaura Denki Kabushiki Kaisha, Kawasaki, Japan and Masatake Hirose, Hiroshima, Japan Signed and Sealed this Eighteenth Day of March 1986

[SEAL]

Attest:

DONALD J. QUIGG

Attesting Officer

Commissioner of Patents and Trademarks